United States Patent [19]

Borden et al.

[11] 4,356,341

[45] Oct. 26, 1982

[54] CASCADE SOLAR CELL HAVING CONDUCTIVE INTERCONNECTS

[75] Inventors: Peter G. Borden, Menlo Park; Ram R. Saxena, Saratoga, both of Calif.

[73] Assignee: Varian Associates, Inc., Palo Alto, Calif.

[21] Appl. No.: 243,676

[22] Filed: Mar. 13, 1981

[51] Int. Cl.³ .............................................. H01L 31/06
[52] U.S. Cl. ...................................... 136/249; 357/30
[58] Field of Search ..................... 136/249 TJ, 255; 357/30

[56] References Cited

U.S. PATENT DOCUMENTS 4,292,092  9/1981  Hanak .................................. 148/1.5
4,295,002  10/1981  Chappell ............................. 136/244

Primary Examiner—Aaron Weisstuch
Attorney, Agent, or Firm—Stanley Z. Cole; Norman E. Reitz

[57] ABSTRACT

Direct ohmic contact between the cells in an epitaxially grown cascade solar cell is obtained by means of conductive interconnects formed through grooves etched intermittently in the upper cell. The base of the upper cell is directly connected by the conductive interconnects to the emitter of the bottom cell. The conductive interconnects preferably terminate on a ledge formed in the base of the upper cell.

8 Claims, 6 Drawing Figures

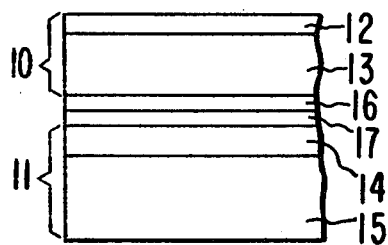
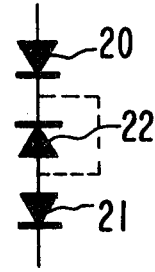
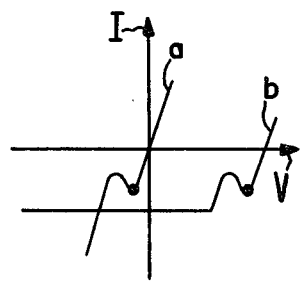
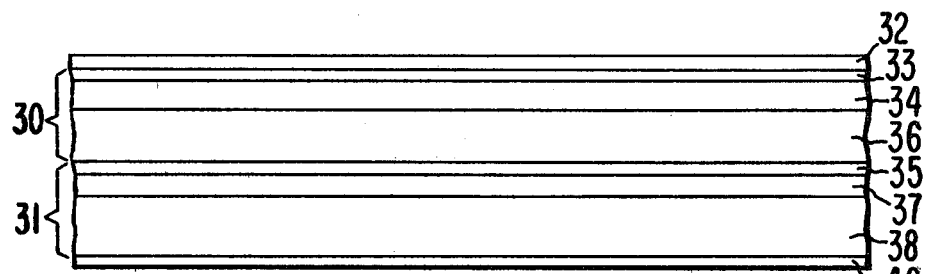
FIG.2a
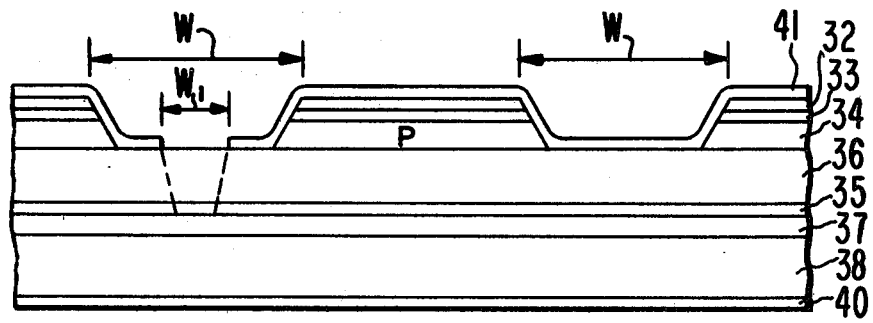
FIG.2b
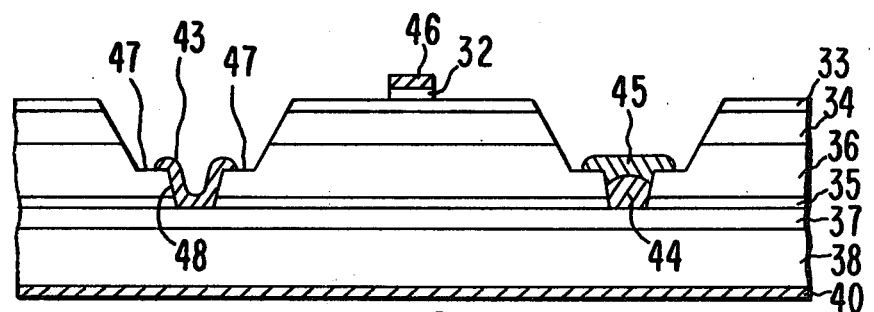
FIG.2c

CASCADE SOLAR CELL HAVING CONDUCTIVE INTERCONNECTS

DESCRIPTION

This invention is related to cascade solar cell work for the Department of Energy under contract XP-9-8081-1 administered by the Solar Energy Research Institute.

This invention relates to an interconnect scheme for stacked solar cells and, more particularly, relates to an interconnect scheme for an epitaxially grown cascade solar cell employing conductive interconnects.

The need to obtain more efficient solar cells especially for concentrator or space applications has led to the concept of stacking cells of varying bandgaps. The so-called cascade solar cell employs a cell with a wide bandgap grown upon or applied to the top of a cell of a narrow bandgap. The cascade solar cell is viewed as having significant promise for obtaining high conversion efficiency. See, e.g., S. M. Bedair, "Material and Device Considerations for Cascade Solar Cells,", IEEE Trans Electron Devices, ED-27, p. 822 (1980). With this type of stacked structure, the cells are usually accessed in series, by virtue of the fact that the bottom layer (base) of the top cell is inherently in intimate contact with the top layer (emitter) of the bottom structure. This is especially the case with stacked cells grown in epitaxial sequence, i.e., when the wide bandgap cell and the narrow bandgap cell have sufficiently close lattice constants for the wide bandgap cell to be epitaxially grown on the narrow bandgap cell. With such cells the accepted interconnect technique has been to fabricate tunnel junctions between the cells. These suffer from the fact that they are exceedingly difficult to fabricate, especially in the high bandgap semiconductors necessary for efficient cascade cells, and from the fact that they exhibit a series voltage drop, usually a few tenths of a volt, which significantly reduces efficiency. In an alternate interconnect scheme it has been proposed to fabricate a shorting junction by providing lattice mismatched layers between the cells. See L. W. James, U.S. Pat. No. 4,017,332, "Solar Cells Employing Stacked Opposite Conductivity Layers". With this scheme it is difficult to fabricate upper wide bandgap cells of sufficient quality due to the presence of the interstitial lattice mismatched layer.

It is an object of the present invention to provide a cascade solar cell having a conductive interconnection between the stacked layers.

It is a further object of the present invention to provide a cascade solar cell having optimized current-voltage characteristics.

It is another object of the present invention to provide a cascade solar cell having grooves formed in the wide bandgap top cell to permit metal interconnects to make ohmic contact between the base of the wide bandgap top cell and the emitter of the narrow bandgap bottom cell.

BRIEF DESCRIPTION OF THE DRAWINGS

For a more complete understanding of the present invention, reference may be had to the accompanying drawings which are incorporated herein by reference and in which:

FIG. 1a is a cross-section of a prior art cascade solar cell employing a tunnel junction interconnection;

FIG. 1b is a circuit equivalent of the tunnel junction of FIG. 1a;

FIG. 1c is a current-voltage curve for the tunnel junction device of FIG. 1a; and FIGS. 2a-2c illustrate the key steps in the process sequence leading to the structure of the present invention shown in completed form in FIG. 2c.

SUMMARY OF THE INVENTION

Direct ohmic contact between the cells in an epitaxially grown cascade solar cell is obtained by means of conductive interconnects formed through grooves etched intermittently in the upper cell. The base of the upper cell is directly connected by the conductive interconnects to the emitter of the bottom cell. The conductive interconnects preferably terminate on a ledge formed in the base of the upper cell. In another preferred embodiment dual level metallization is used so the upper level makes optimum contact with the base of the upper cell and the lower level makes optimum contact with the emitter of the lower cell.

DESCRIPTION OF THE PREFERRED EMBODIMENTS

In this specification the terms wide bandgap cell and narrow bandgap cell refer to the upper and lower cells in a two cell epitaxially grown cascade stack. The values for the bandgap are relative and are chosen for efficiency and device considerations. In addition, the formula for the ternary compound semiconductor $Al_xGa_{1-x}As$ is rendered AlGaAs with the understanding that the specific composition can be varied as is well known in the art in order to obtain a desired bandgap. For cascade solar cells employing quaternary compound semiconductor layers such as InGaAsP the proportionality of constituents may be varied to obtain the desired lattice constant as well as bandgap.

The state of the art technique for interconnecting stacked epitaxially grown solar cells is the so-called tunnel junction. A typical so-called tunnel junction is shown in cross-section in FIG. 1a to be formed inbetween wide bandgap cell 10 and narrow bandgap cell 11. For example, in the case where both solar cells are of p on n configuration the emitters 12 and 14 may, respectively, be p-type AlGaAs and p-type GaAs and the bases 13 and 15 may, respectively, be n-type AlGaAs and n-type GaAs. Cell 10 will typically have a bandgap of about 1.7 ev and cell 11 will typically have a bandgap of about 1.1 ev. Region 16 will be highly doped n++ material and region 17 will be highly doped p++ material. The adjacent highly doped materials make a tunnel junction to form a series connection in the cell. This connection is imperfect, as indicated by the circuit equivalent shown in FIG. 1b, because it introduces the voltage drop of inverted tunnel diode 22 into the cell circuit modelled by diodes 20 and 21. The result is that this voltage drop is lost from the output of the cell, reducing overall efficiency. It should also be noted that tunnel juctions over areas suitable for solar cells have not been demonstrated. Demonstration has occurred only by liquid phase epitaxy and molecular beam epitaxy whereas vapor phase epitaxy is presently considered the only growth technique with high enough throughput for economical solar cell fabrication. As seen in FIG. 1c, a tunnel junction has a characteristic negative resistance region, giving a kink in its forward current-voltage characteristic curve a. Since the tunnel junction is in series with the upper and lower cells, this kink may appear in the current-voltage characteristic curve b of the cascade cell. This kink results in a reduced fill factor and in reduced efficiency.

The cascade cell of the present invention having conductive interconnects is fabricated by a process which takes a fully formed cascade solar cell (but without interconnects) as shown in FIG. 2a and etches through the top cell 30 to open up the emitter 37 of the bottom cell 31. The two cells, 30 and 31, are then interconnected as shown in FIG. 2c. The top cell 30 consists of GaAs cap layer 32, AlGaAs window layer 33, p-type AlGaAs emitter 34, and n-type AlGaAs base 36. Bottom cell 31 consists of n-type AlGaAs etch stop layer 35, p-type GaAs emitter 37 and n-type GaAs base 38. A preferred etch stop layer 35 has a higher bandgap than either the top or bottom cell, and changes conductivity type from n+ at the top to p+ at the bottom to serve the purpose of carrier confinement. The interconnects 43 or 45, 44 may be metal, conductive polysilicon, a conductive polymer or any conductive material compatible with the semiconductor materials of the cells. Backside metallization 40 is applied to the bottom of base 38. The circuit equivalent of the cascade solar cell of the present invention can be seen in FIG. 1b, if the dotted lines are considered, to make an ohmic interconnection between diodes 20 and 21.

Standard photolithographic techniques are used to define a succession of window openings W. The windows are formed by use of an etch which etches through AlGaAs emitter 34 at least to the top of base 36, as shown in FIG. 2b, but in the preferred embodiment ledge 47 (FIG. 2c) is produced to about half the depth of the base 36. Then a narrower opening, $W_1$, shown in FIG. 2b, is photolithographically defined and etched down through AlGaAs window layer 35 to emitter 37 of bottom cell 31. A single contact 43 may then be used to interconnect base 36 of top cell 30 and emitter 37 of bottom cell 31. Typically, the surface area taken up by the windows is 10% or less of the total area of the top cell. In a preferred embodiment, this contact 43 runs up the sidewall 48 of the groove defining window $W_1$ and onto ledge 47 to produce a positive contact. Ledge 47 permits a reliable ohmic contact to be made to base 36 in the manner described in P. G. Borden, "Monolithic Series Connected Solar Cell", Ser. No. 69,462, filed Aug. 24, 1979, now U.S. Pat. No. 4,278,473. Topside metal contacts 46 are then applied; the quality of this contact is enhanced by the presence of GaAs cap layer 32.

In another embodiment dual level conductive contacts are used to form the interconnects. This approach is especially appropriate when metals are used since specific metals make optimum ohmic contacts with particular semiconductor materials. Thus metal 44 can be selected so that it makes a low resistance ohmic contact with the material and conductivity type of emitter 37 and metal 45 can be selected so that it makes a low resistance ohmic contact with the material and conductivity type of base 36.

A particular process sequence for fabricating a metal interconnected cascade solar cell in accordance with the present invention is described.

A. Etch wide groove W through emitter to the base of top cell:
  1. Calibrate etch rate in AlGaAs;
  2. Etch GaAs cap layer in GaAs specific etch down to the AlGaAs layer. See, e.g., G. A. Antypas, et. al., "Glass-Sealed GaAsAlGaAs Transmission Photocathode", App. Phys. Lett., v. 26, p. 371 (1975).
  3. Etch 90% AlGaAs in HF;
  4. Etch AlGaAs w/calibrated etch (use same etch as in step 2; etch into base of top cell). In alternative embodiment, a dopant specific etch, e.g., 1:1:10 $H_2O:H_2O_2:H_2SO_4$) which etches p but not n in the dark, stops at the n layer. Another embodiment is to use anodic etching, thereby providing an accurate rate and control.

B. Etch narrow groove, $W_1$ within wide groove, W:
  1. Etch to buried AlGaAs window layer of bottom cell using the same etch as in A2 and A4;
  2. Etch through AlGaAs layer with HF. This step also etches the $SiO_2$ to open up the top contact.

C. Form metal interconnects for p on n solar cells of the example:
  1. Evaporate p-type contact metal over defined photoresist to fill groove and contact emitter of bottom cell;
  2. For dual layer metalization remask and evaporate n-type metal to contact base of top cell.

In another embodiment the interconnect scheme of the present invention is applied to a cascade cell which contains three cells stacked together. The top cell has a high bandgap on the order of 1.8 ev, the intermediate cell has a lower bandgap on the order of 1.2 ev while the bottom cell has a low bandgap on the order of 0.7 ev. The cells are typically epitaxially grown in sequence. As known in the art, tunnel junctions between lower bandgap cells are more readily obtained. Thus, the bottom and intermediate cells may be connected by a conventional tunnel junction or by other schemes. The top cell and the intermediate cell are interconnected by the scheme of the present invention shown in FIGS. 2a–2c. The processing of this triple cascade cell is essentially that set out above except that the starting material of FIG. 2a includes the low bandgap cell at the bottom of the epitaxial sequence.

The cascade solar cell of the present invention having conductive interconnects may be fabricated in a number of materials systems. The criterion is that cells must be epitaxially grown one on the other and grooves must be capable of being formed intermittently in the top cell. This criterion is met in those systems for which there exists selective etches, i.e., etches which will etch nicely through the top cell but stop upon encountering the bottom cell. The AlGaAs/GaAs system described above is one instance. Other systems having such etch properties are AlInGaAs/InP and GaAlAsSb/GaAs.

We claim:

1. A cascade solar cell having a wide bandgap cell epitaxially grown on a narrow bandgap cell and being electrically connected in series therewith, the improvement comprising:
    said cells being electrically connected by means of a conductive interconnection formed between the base of the top cell and the emitter of the bottom cell through grooves formed in the top cell.

2. A cascade solar cell in accordance with claim 1 wherein said conductive interconnection comprises a metal interconnection.

3. A cascade solar cell in accordance with claim 2 wherein said grooves comprise a wider portion at the top and a narrow portion at the bottom so that a ledge is formed in the base of said wide bandgap cell and wherein said metal interconnection extends into said narrow portion to contact said emitter of said bottom cell and said metal interconnection terminates on said ledge.

4. A cascade solar cell in accordance with claim 3 wherein said wide bandgap cell is fabricated from AlGaAs and wherein said narrow bandgap cell is fabricated from GaAs.

5. A cascade solar cell in accordance with claim 3 wherein said metal interconnection comprises a dual level metallization with the upper level contacting said base of said wide bandgap cell and with the lower level contacting said emitter of said narrow bandgap cell so that optimum ohmic contact may be made by the selected metals to the respective base and emitter regions.

6. A cascade solar cell in accordance with claim 1 in combination with a third solar cell having a bandgap narrower than the bandgap of said bottom cell, said third cell being positioned below and in conductive contact with said bottom cell.

7. A cascade solar cell in accordance with claim 6 wherein said third solar cell is electrically connected to said bottom cell by means of a tunnel junction.

8. A cascade solar cell in accordance with claim 6 wherein said three cells are grown in epitaxial relationship.

* * * * *